(12) United States Patent
Matsuo

(10) Patent No.: US 10,264,695 B2
(45) Date of Patent: Apr. 16, 2019

(54) POWER CONVERTER

(71) Applicant: HITACHI AUTOMOTIVE SYSTEMS, LTD., Hitachinaka-shi, Ibaraki (JP)

(72) Inventor: Takeshi Matsuo, Hitachinaka (JP)

(73) Assignee: HITACHI AUTOMOTIVE SYSTEMS, LTD., Ibaraki (JP)

( * ) Notice: Subject to any disclaimer, the term of this patent is extended or adjusted under 35 U.S.C. 154(b) by 0 days.

(21) Appl. No.: 15/328,091

(22) PCT Filed: Jun. 8, 2015

(86) PCT No.: PCT/JP2015/066426
§ 371 (c)(1),
(2) Date: Jan. 23, 2017

(87) PCT Pub. No.: WO2016/047212
PCT Pub. Date: Mar. 31, 2016

(65) Prior Publication Data
US 2017/0223859 A1  Aug. 3, 2017

(30) Foreign Application Priority Data

Sep. 25, 2014 (JP) .................. 2014-194625

(51) Int. Cl.
| H02M 1/14 | (2006.01) |
| H02M 7/00 | (2006.01) |
| H02M 7/44 | (2006.01) |
| H05K 7/14 | (2006.01) |
| H05K 7/20 | (2006.01) |

(52) U.S. Cl.
CPC ............ *H05K 7/1427* (2013.01); *H02M 1/14* (2013.01); *H02M 7/003* (2013.01); *H02M 7/44* (2013.01); *H05K 7/20927* (2013.01)

(58) Field of Classification Search
CPC . G06F 1/181–1/182; H05K 7/20218–7/20381;
(Continued)

(56) References Cited

U.S. PATENT DOCUMENTS 8,787,003 B2 * 7/2014 Domes ................ H05K 7/1432
  174/529
9,072,197 B2 * 6/2015 Murata .............. H05K 7/20236
(Continued)

FOREIGN PATENT DOCUMENTS

| JP | 11-136960 A | 5/1999 |
| JP | 2006-204027 A | 8/2006 |
(Continued)

*Primary Examiner* — Robert J Hoffberg
*Assistant Examiner* — Razmeen Gafur
(74) *Attorney, Agent, or Firm* — Volpe and Koenig, P.C.

(57) ABSTRACT

A power converter includes a power semiconductor module, a control circuit board, and a case. The power semiconductor module includes a switching element and a metal module case for forming a storage space to store the switching element. The case includes a resin case, a metal case, and a metal base. The resin case stores the power semiconductor module. The metal case stores the control circuit board. The metal base is disposed so as to separate a storage space of the resin case and a storage space of the metal case. The resin case forms a refrigerant flow channel. The metal base includes a first opening. The power semiconductor module is disposed such that the storage space of the module case and the storage space of the metal case are connected via the first opening of the metal base.

5 Claims, 8 Drawing Sheets

(58) Field of Classification Search
CPC ............... H05K 7/20409–7/20418; H05K 7/20009–7/202; H05K 7/1427; H05K 7/20927; H01L 23/367–23/3677; H01L 23/473; H01L 23/46–23/467; H02M 1/14; H02M 7/003; H02M 7/44
USPC ...... 361/676–678, 679.46–679.54, 688–723; 165/80.1–80.5, 104.33, 185; 174/15.1–15.3, 16.1–16.3, 547, 548; 257/712–722, E23.088; 24/453, 458–459; 454/184; 312/236
See application file for complete search history.

(56) References Cited

U.S. PATENT DOCUMENTS

| | | | | |
|---|---|---|---|---|
| 9,165,858 B2* | 10/2015 | Steger | | H01L 23/473 |
| 2004/0223301 A1* | 11/2004 | Muller | | H02M 7/003 |
| | | | | 361/699 |
| 2005/0093123 A1* | 5/2005 | Yoshida | | H01L 23/36 |
| | | | | 257/678 |
| 2005/0259402 A1* | 11/2005 | Yasui | | H02M 7/003 |
| | | | | 361/716 |
| 2005/0270745 A1* | 12/2005 | Chen | | H01F 27/2804 |
| | | | | 361/707 |
| 2006/0284308 A1* | 12/2006 | Harada | | H01L 25/072 |
| | | | | 257/729 |
| 2007/0096278 A1* | 5/2007 | Nakatsu | | H01L 23/3675 |
| | | | | 257/678 |
| 2007/0165376 A1* | 7/2007 | Bones | | H01L 25/162 |
| | | | | 361/688 |
| 2008/0225487 A1* | 9/2008 | Nakajima | | H02M 7/003 |
| | | | | 361/699 |
| 2009/0002974 A1* | 1/2009 | Yahata | | B60L 15/20 |
| | | | | 361/820 |
| 2009/0231811 A1* | 9/2009 | Tokuyama | | H01L 23/36 |
| | | | | 361/699 |
| 2010/0025126 A1* | 2/2010 | Nakatsu | | B60L 11/00 |
| | | | | 180/65.1 |
| 2010/0165680 A1* | 7/2010 | Yoshinaga | | B60L 11/1803 |
| | | | | 363/123 |
| 2010/0208427 A1* | 8/2010 | Horiuchi | | H05K 7/20927 |
| | | | | 361/699 |
| 2011/0194249 A1* | 8/2011 | Nakasaka | | H01L 23/473 |
| | | | | 361/689 |
| 2011/0199736 A1* | 8/2011 | Sawada | | H05K 7/20909 |
| | | | | 361/722 |
| 2011/0221268 A1* | 9/2011 | Kanazawa | | H05K 1/0263 |
| | | | | 307/10.1 |
| 2011/0235276 A1* | 9/2011 | Hentschel | | H01L 23/473 |
| | | | | 361/699 |
| 2011/0292611 A1* | 12/2011 | Higuchi | | H01L 23/3675 |
| | | | | 361/717 |
| 2012/0139096 A1* | 6/2012 | Gohara | | H01L 23/3735 |
| | | | | 257/706 |
| 2012/0188712 A1* | 7/2012 | Ishibashi | | H02M 7/003 |
| | | | | 361/688 |
| 2012/0229985 A1* | 9/2012 | Okumura | | H01L 25/18 |
| | | | | 361/716 |
| 2012/0236500 A1* | 9/2012 | Higuchi | | H01L 23/473 |
| | | | | 361/699 |
| 2012/0241953 A1* | 9/2012 | Yamada | | H01L 23/4334 |
| | | | | 257/737 |
| 2012/0250380 A1* | 10/2012 | Ichijyo | | H05K 7/20927 |
| | | | | 363/123 |
| 2012/0257352 A1* | 10/2012 | Liu | | G06F 1/188 |
| | | | | 361/695 |
| 2012/0262877 A1* | 10/2012 | Nagano | | H01G 2/10 |
| | | | | 361/690 |
| 2012/0262884 A1* | 10/2012 | Meinecke | | H02H 7/065 |
| | | | | 361/722 |
| 2012/0287576 A1* | 11/2012 | Takatsuka | | H05K 7/209 |
| | | | | 361/690 |
| 2012/0326295 A1* | 12/2012 | Oota | | H01L 23/047 |
| | | | | 257/712 |
| 2013/0058143 A1* | 3/2013 | Tachibana | | H02M 7/003 |
| | | | | 363/131 |
| 2013/0077255 A1* | 3/2013 | Abe | | H01L 23/36 |
| | | | | 361/716 |
| 2013/0114206 A1* | 5/2013 | Schramm | | H05K 7/1432 |
| | | | | 361/688 |
| 2013/0181228 A1* | 7/2013 | Usui | | H01L 23/4334 |
| | | | | 257/77 |
| 2013/0271917 A1* | 10/2013 | Steger | | H01L 23/473 |
| | | | | 361/699 |
| 2013/0301220 A1* | 11/2013 | Hotta | | H05K 7/20218 |
| | | | | 361/699 |
| 2013/0335920 A1* | 12/2013 | Murata | | H05K 7/20236 |
| | | | | 361/699 |
| 2014/0124909 A1* | 5/2014 | Masunaga | | H01L 23/495 |
| | | | | 257/666 |
| 2014/0160822 A1* | 6/2014 | Kuwano | | H02M 7/003 |
| | | | | 363/141 |
| 2014/0167235 A1* | 6/2014 | Horie | | H01L 23/049 |
| | | | | 257/669 |
| 2014/0167248 A1* | 6/2014 | Delgado | | H01L 23/46 |
| | | | | 257/713 |
| 2014/0185242 A1* | 7/2014 | Kim | | H05K 7/209 |
| | | | | 361/707 |
| 2014/0346659 A1* | 11/2014 | Nakamura | | H02M 7/003 |
| | | | | 257/704 |
| 2014/0355212 A1* | 12/2014 | Campbell | | H05K 7/20236 |
| | | | | 361/699 |
| 2015/0145123 A1* | 5/2015 | Ha | | H01L 23/49811 |
| | | | | 257/737 |
| 2015/0189790 A1* | 7/2015 | Tachibana | | H05K 7/20254 |
| | | | | 361/699 |
| 2015/0195951 A1* | 7/2015 | Long | | H05K 7/20927 |
| | | | | 361/699 |
| 2015/0195957 A1* | 7/2015 | Ohoka | | H05K 7/20927 |
| | | | | 361/702 |
| 2015/0271956 A1* | 9/2015 | Sun | | H05K 7/20927 |
| | | | | 361/692 |
| 2015/0282291 A1* | 10/2015 | Singh | | H05K 1/021 |
| | | | | 361/689 |
| 2015/0296661 A1* | 10/2015 | Mari Curbelo | | H01L 23/427 |
| | | | | 361/700 |
| 2015/0334875 A1* | 11/2015 | Topolewski | | H05K 7/20254 |
| | | | | 361/699 |
| 2016/0037654 A1* | 2/2016 | Kosuga | | H02M 7/003 |
| | | | | 361/807 |
| 2016/0037677 A1* | 2/2016 | Yamanaka | | H05K 7/20918 |
| | | | | 361/697 |
| 2016/0095264 A1* | 3/2016 | Kaneko | | H02M 7/003 |
| | | | | 361/699 |
| 2016/0128235 A1* | 5/2016 | Jacobson | | H01F 27/025 |
| | | | | 361/702 |
| 2016/0261180 A1* | 9/2016 | Brueckner | | H02M 1/32 |
| 2016/0270268 A1* | 9/2016 | Suzuki | | H02M 7/003 |
| 2016/0322280 A1* | 11/2016 | Schmit | | H01L 23/473 |
| 2017/0033593 A1* | 2/2017 | Kamizuma | | H02M 7/217 |
| 2017/0142860 A1* | 5/2017 | Takeuchi | | H05K 7/2049 |
| 2017/0155342 A1* | 6/2017 | Deboy | | H02M 7/53871 |
| 2017/0271240 A1* | 9/2017 | Inoue | | H01L 25/18 |
| 2017/0301662 A1* | 10/2017 | Kimura | | H01L 23/433 |
| 2017/0313159 A1* | 11/2017 | Takagi | | B60H 1/00914 |
| 2018/0026545 A1* | 1/2018 | Numakura | | H02M 7/48 |
| | | | | 361/689 |
| 2018/0040538 A1* | 2/2018 | Schuderer | | H01L 23/473 |
| 2018/0130721 A1* | 5/2018 | Mizuno | | H01L 23/40 |
| 2018/0158761 A1* | 6/2018 | Sugimachi | | H01L 23/3114 |

FOREIGN PATENT DOCUMENTS

| | | |
|---|---|---|
| JP | 2008-228502 A | 9/2008 |
| JP | 2009-247066 A | 10/2009 |
| JP | 2010-035347 A | 2/2010 |
| JP | 2010-087002 A | 4/2010 |
| JP | 2010-110143 A | 5/2010 |

(56) References Cited

FOREIGN PATENT DOCUMENTS

| | | |
|---|---|---|
| JP | 2014-171343 A | 9/2014 |
| JP | 5592496 B2 | 9/2014 |
| WO | 2010/090326 A1 | 8/2010 |
| WO | 2012/043088 A1 | 4/2012 |
| WO | 2014/132710 A1 | 9/2014 |
| WO | 2014/136354 A1 | 9/2014 |

\* cited by examiner

POWER CONVERTER

TECHNICAL FIELD

The present invention relates to a power converter and especially relates to a power converter for a vehicle.

BACKGROUND ART

In an invention described in JP 2010-110143 A, a power semiconductor element is stored in a storage space formed by a metal heat dissipation base 304 as described in FIGS. 5 and 6, the heat dissipation base is stored in a cooling jacket 19 of a case 12 such that a storage portion for the power semiconductor element is projected on a water channel side, and upper and lower openings of the case 12 are closed by an upper cover 10 and a lower cover 16, respectively.

In recent years, it is required to reduce the weight of in-vehicle parts to improve fuel consumption of a hybrid vehicle and an electric vehicle and also required to reduce the weight of a power converter. In the case of the weight reduction, resin material which is lighter than a metal material can be used for in-vehicle parts.

On the other hand, in the power converter, it is necessary to sufficiently consider a noise countermeasure since the power converter includes both of a high power system in which power for a motor for driving is input and a low power system for driving a control circuit.

CITATION LIST

Patent Literature

PTL 1: JP 2010-110143 A

SUMMARY OF INVENTION

Technical Problem

An issue to be solved by the present invention is to improve noise immunity of a power converter using a resin material.

Solution to Problem

A power converter according to the present invention includes a power semiconductor module, a control circuit board, and a case. The power semiconductor module converts DC power into AC power. The control circuit board controls the power semiconductor module. The case stores the power semiconductor module and the control circuit board. The power semiconductor module includes a switching element and a metal module case forming a storage space to store the switching element. The case includes a resin case, a metal case, and a metal base. The resin case stores the power semiconductor module. The metal case stores the control circuit board. The metal base is disposed so as to separate a storage space of the resin case and a storage space of the metal case. The resin case forms a refrigerant flow channel in which a refrigerant for cooling the power semiconductor module flows. The power semiconductor module is disposed such that the module case is projected in the refrigerant flow channel. The metal base includes a first opening. The power semiconductor module is disposed such that the storage space of the module case and the storage space of the metal case are connected via the first opening of the metal base. The metal case, the metal base, and the module case are electrically connected.

Advantageous Effects of Invention

According to the present invention, noise immunity of a power converter using a resin material can be improved.

DESCRIPTION OF EMBODIMENTS

Hereinafter, embodiments of the present invention will be described with reference to drawings.

Figure 1:
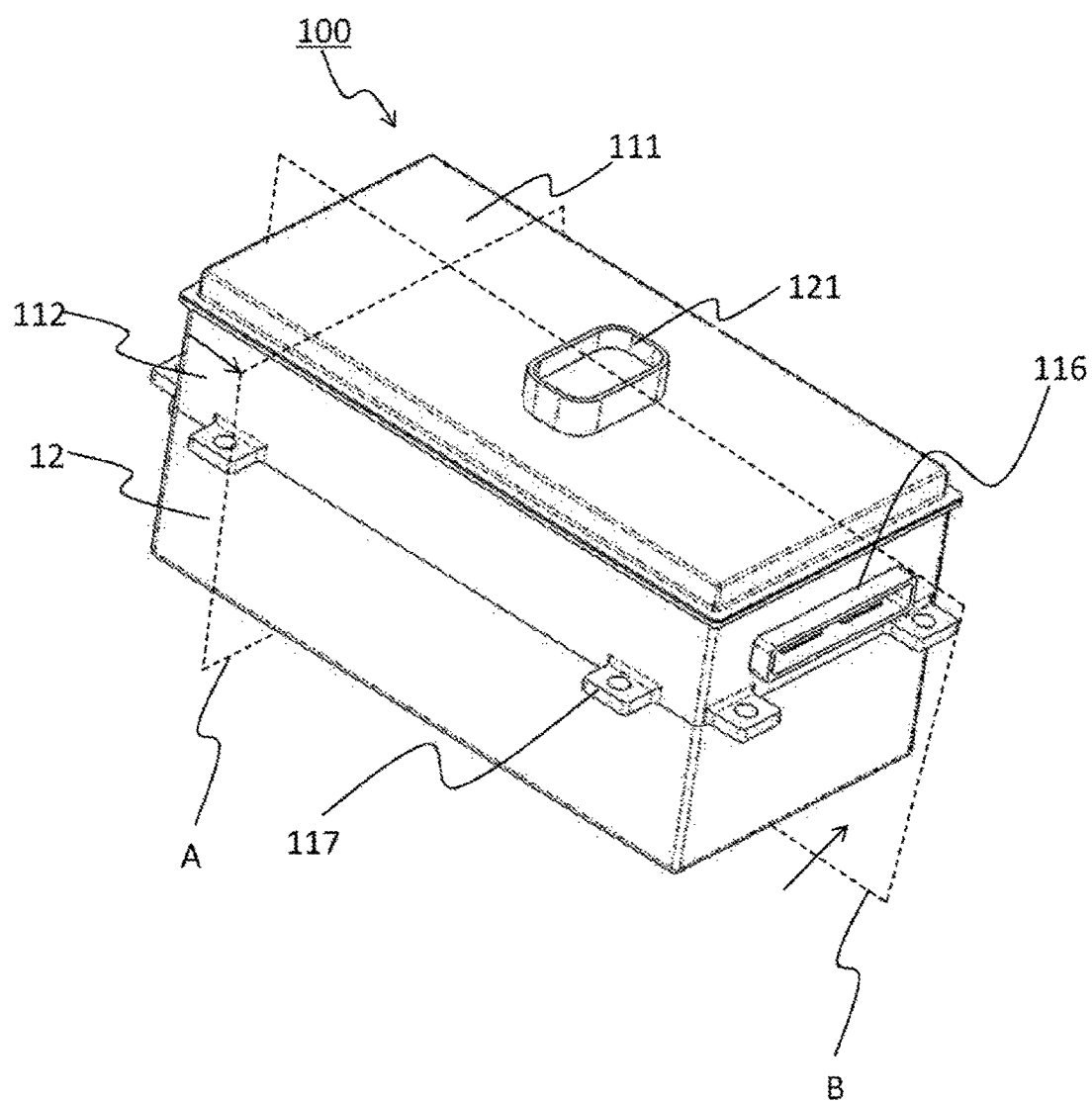
FIG. 1 is an external perspective view of a power converter 100 according to an embodiment described herein.

FIG. 1 is an external perspective view of a power converter 100 according to an embodiment described herein. The power converter 100 according to the embodiment described herein is formed roughly by three stages from an upper portion to a bottom portion, and a top cover 111, a middle case 112, and a resin case 12 are combined from the top. The top cover 111 is formed of metal and disposed at an upper portion of the middle case 112. The top cover 111 includes a signal connector 121 projected upward. A gap between the signal connector 121 and the top cover 111 is sealed as needed for waterproof and dustproof.

The top cover 111 forms a flange 101 on a mating surface between the top cover 111 and the middle case 112, and the flange 101 and the middle case 112 can be joined and sealed. The top cover 111 can be fixed to the middle case 112 by fastening by a bolt after sandwiching such as a gasket therebetween or by adhering with such as an adhesive without using a bolt.

The middle case 112 is formed of metal and forms a storage space 119 (to be described in FIG. 5) covered by metal in the middle case 112 by combining with the top cover 111. In the storage space 119, the control board 30, a current sensor 37, a part of a power semiconductor module 2 are stored (to be described in FIG. 5). The middle case 112 includes a fixing portion 117 for fixing such that the power converter 100 can be fixed in a certain place in a vehicle. A bolt hole for fixing is formed at a center of the fixing portion 117.

The middle case 112 includes, on a side surface, an AC side interface 115 (refer to FIG. 4) and a DC side interface 116 which are high power systems. The AC side interface 115 is connected to a motor via an AC terminal which is a high power connector. The DC side interface 116 is connected to a battery via a DC side power terminal which is a high power connector.

A resin case 12 is disposed at a position opposed to the top cover 111 across the middle case 112. The resin case 12 and the middle case 112 are joined by, for example, chemically processing or mechanically roughening a surface on the middle case 112 side and by injection-molding resin. Alternatively, the resin case 12 and the middle case 112 can be formed separately and joined by an adhesive.

The resin case 12 forms a flow channel for cooling the power semiconductor module 2 therein.

Figure 2:
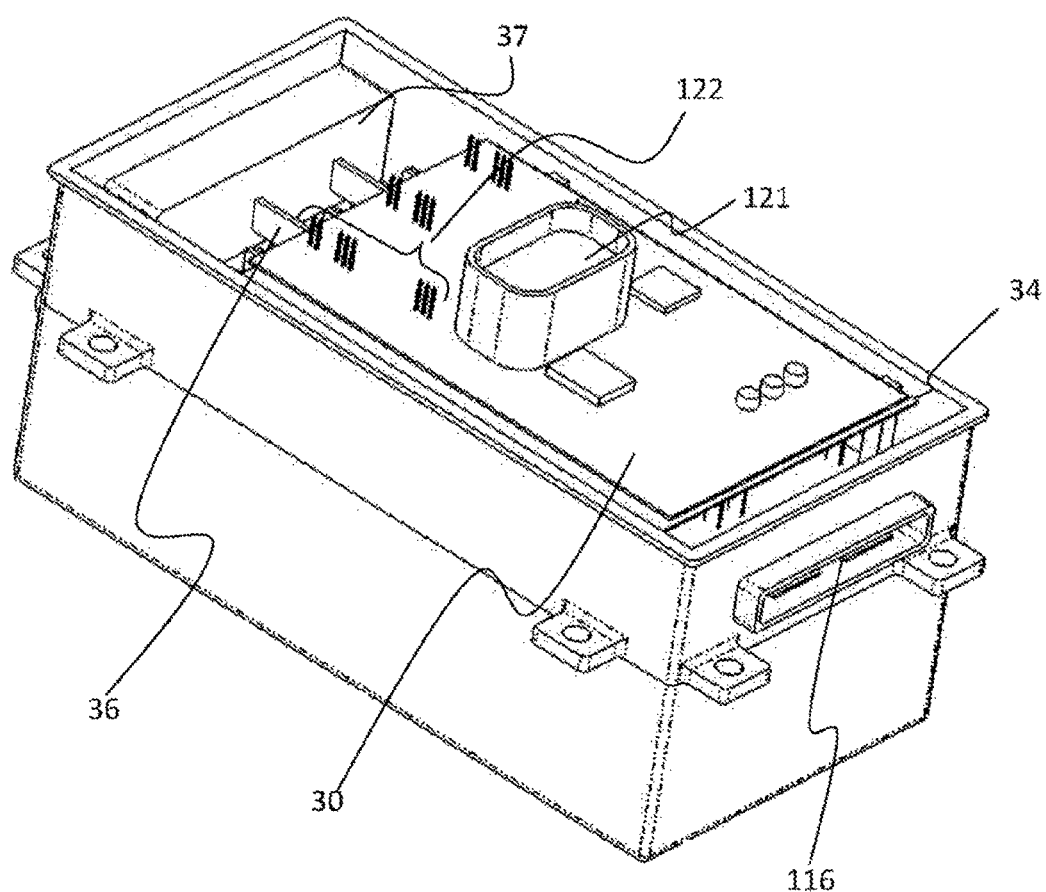
FIG. 2 is a perspective view illustrating a state in which a top cover 111 is removed from the power converter 100 illustrated in FIG. 1.

FIG. 2 is a perspective view illustrating a state in which the top cover 111 is removed from the power converter 100 illustrated in FIG. 1.

Three AC side bus bars 36, in which three-phase DC power flowing from the power converter 100 to a motor flows, penetrate in the current sensor 37, and the current sensor 37 detects a value of the current and transmits the value to the control board 30.

The control board 30 includes a motor outside the power converter 100 and the signal connector 121 for providing and receiving information to and from a vehicle. The control board 30 is separated into a motor control circuit unit and a gate driving circuit unit. The motor control circuit unit calculates a current to be output to a motor and computes a timing to turn on and off a switching element of the power semiconductor module 2 according to a result of the calculation. The gate driving circuit unit turns on and off the switching element according to the determined timing. A control pin 122 extending from the power semiconductor module 2 is penetrated in the gate driving circuit unit, and the gate driving circuit unit and the power semiconductor module 2 are electrically connected.

The board base 34 is disposed so as to cover a lower side of the control circuit board 30 and has a function to block noise by electrical grounding of the control circuit board 30 and by a bus bar disposed in a lower portion of the control circuit board 30.

Figure 3:
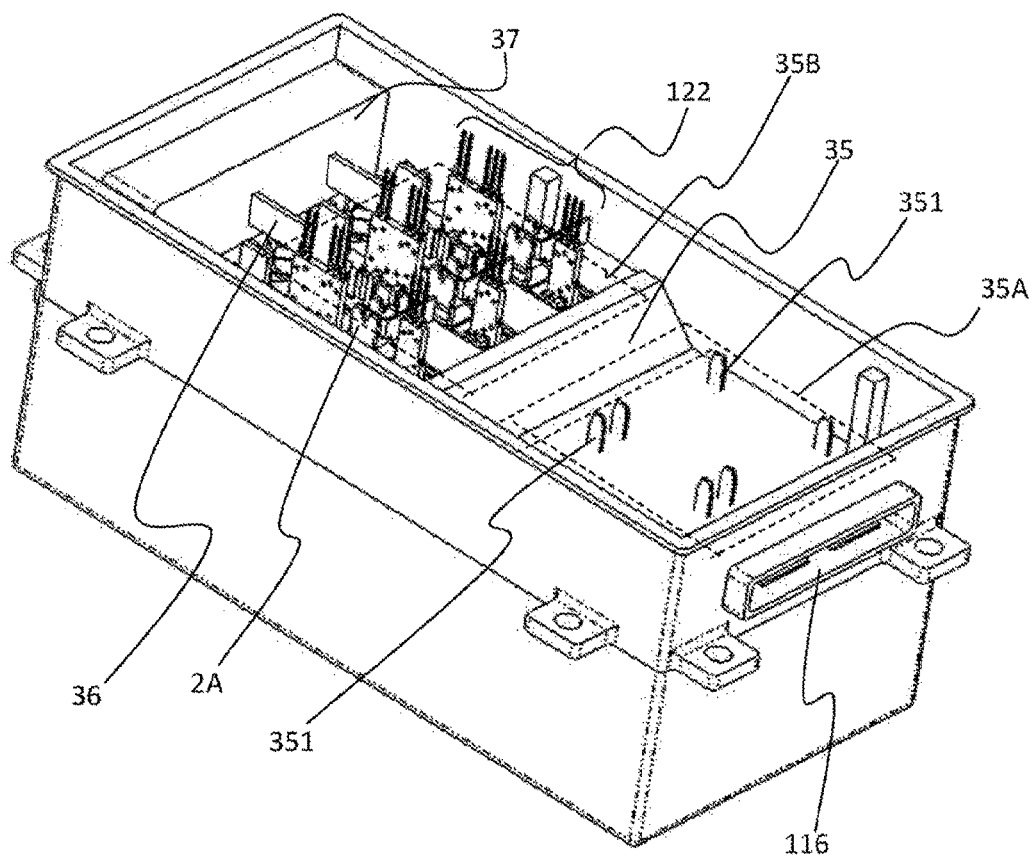
FIG. 3 is a perspective view of the power converter 100 in which a control board 30 and a board base 34 illustrated in FIG. 2 are removed.

FIG. 3 is a perspective view of the power converter 100 in which the control board 30 and the board base 34 illustrated in FIG. 2 are removed.

The DC side bus bar 35 includes two conductor plates having different polarities. The two conductor plates are laminated via an insulating layer having a certain thickness, and two bus bars are integrated by molding surfaces of the two conductor plates by resin. In addition, the DC side bus bar 35 includes a first area 35A and a second area 35B. The first area 35A is wide and flattened so as to be connected to a capacitor lead 351. The second area 35B is connected to a DC terminal 2A of the power semiconductor module 2 and formed narrower than the first area 35A. In the second area 35B, a part of the two conductor plates is projected from mold resin and connected to the DC terminal 2A.

Figure 4:
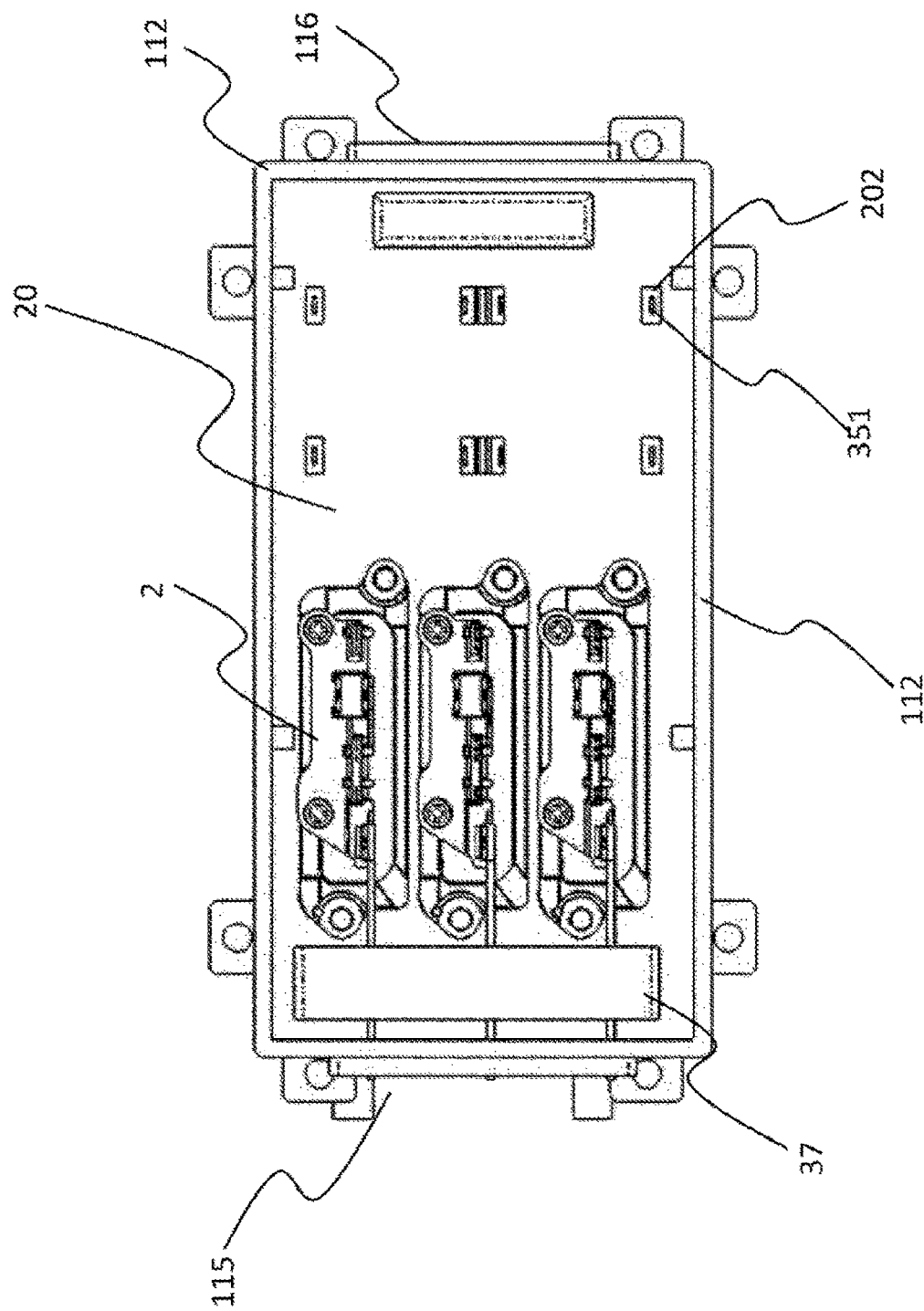
FIG. 4 is a top view illustrating a state in which a DC side bus bar 35 is removed from the power converter 100 illustrated in FIG. 3.
Figure 5:
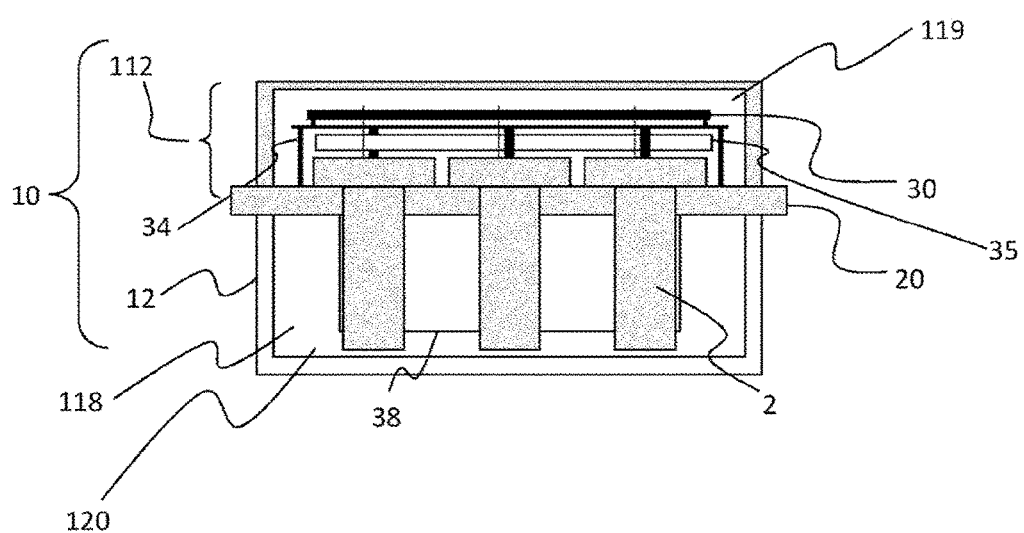
FIG. 5 is a sectional view of the power converter 100 when viewed from an arrow direction of a plane A illustrated in FIG. 1.
Figure 6:
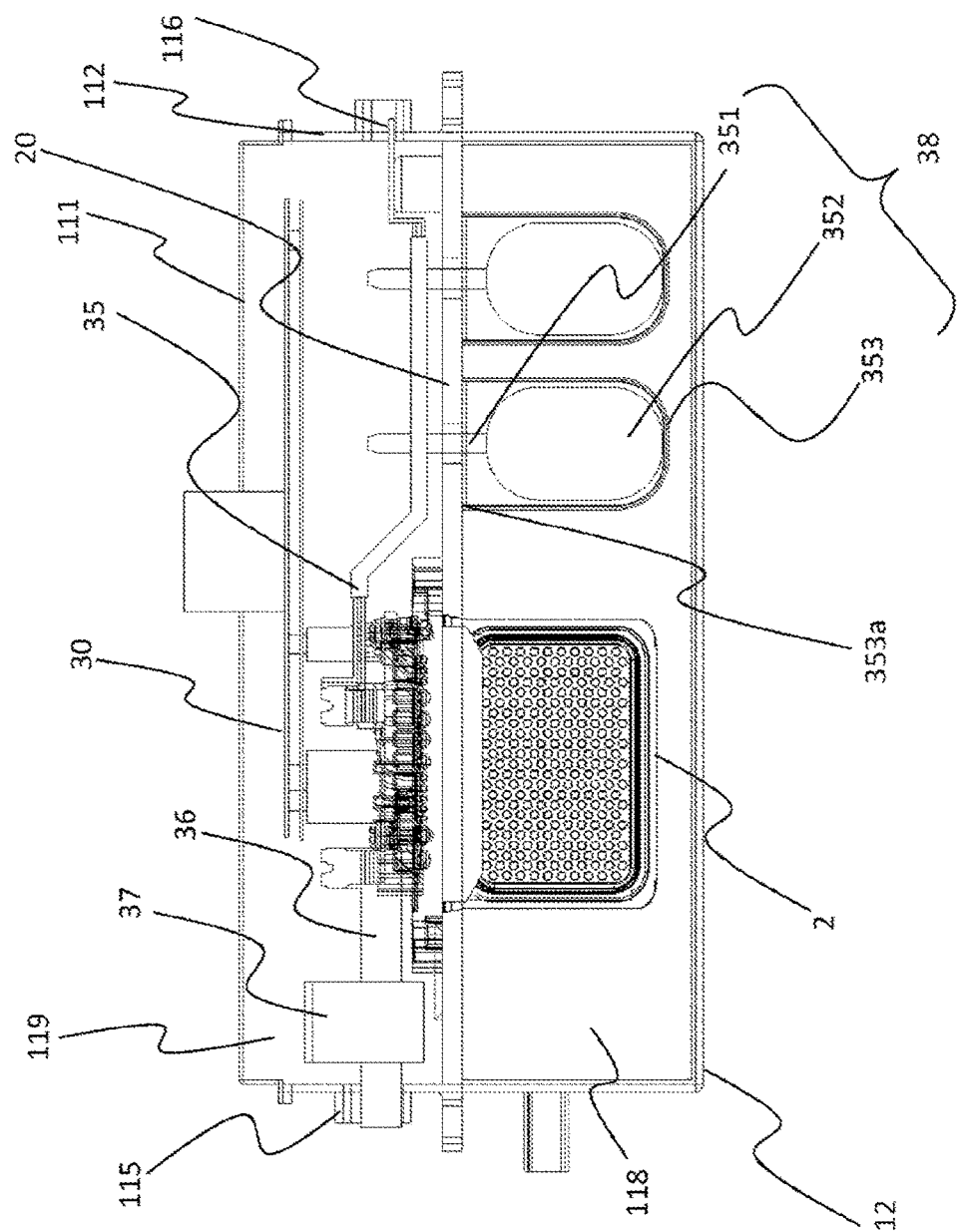
FIG. 6 is a sectional view of the power converter 100 when viewed from an arrow direction of a plane B illustrated in FIG. 1.
Figure 7:
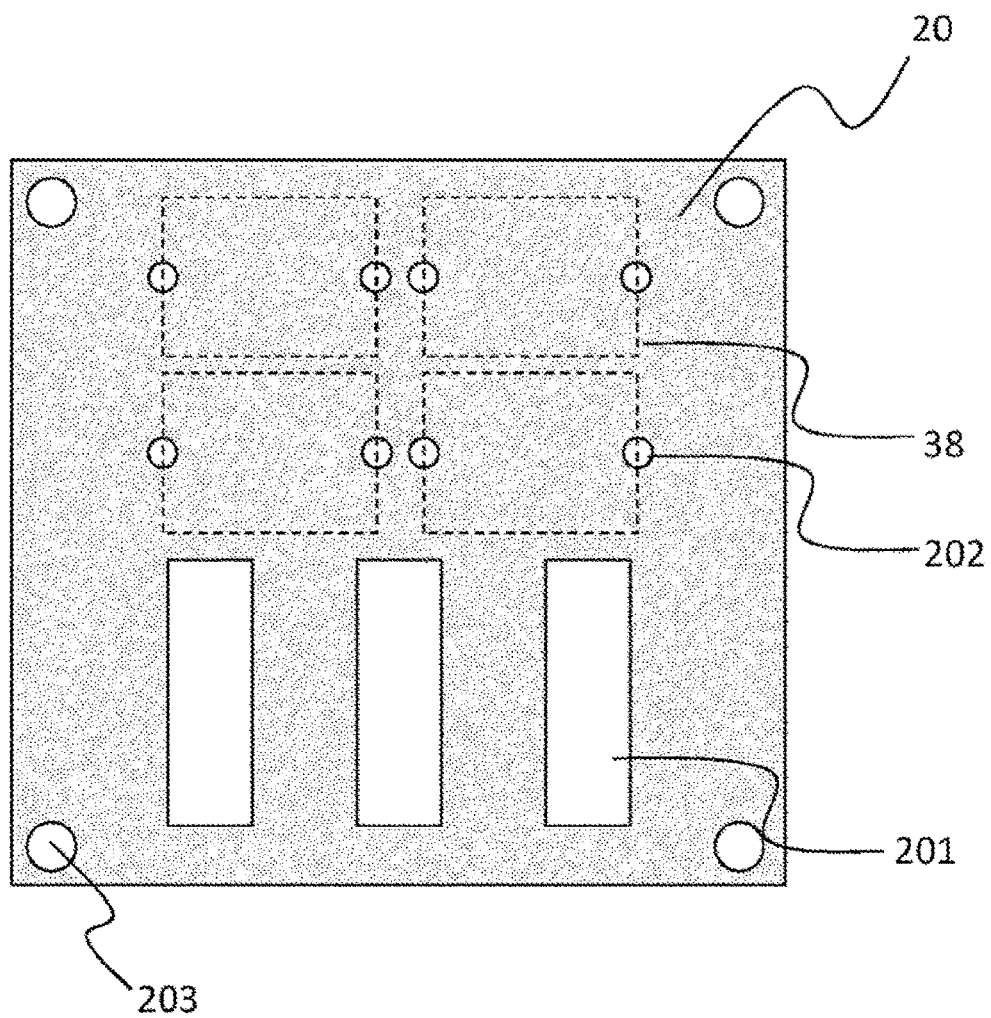
FIG. 7 is a schematic view of a metal base 20 when viewed from a side where a top cover 111 is disposed.

FIG. 4 is an top view illustrating a state in which the DC side bus bar 35 is removed from the power converter 100 illustrated in FIG. 3. FIG. 5 is a sectional view of the power converter 100 when viewed from an arrow direction of a plane A illustrated in FIG. 1. FIG. 6 is a sectional view of the power converter 100 when viewed from an arrow direction of a plane B illustrated in FIG. 1. FIG. 7 is a schematic view of the metal base 20 when viewed from a side where the top cover 111 is disposed.

The middle case 112 forms an opening 202. The capacitor lead 351 to be connected to a smoothing capacitor 38 penetrates through the opening 202.

The smoothing capacitor 38 may cause a noise. Therefore, preferably a size of the opening 202 is minimized while securing a necessary insulating distance between the capacitor lead 351 and an end of the opening 202.

Three power semiconductor modules 2 are parallelly disposed next to an area in which the capacitor lead 351 is projected, and one of the power semiconductor modules 2 includes an upper arm and a lower arm of an inverter circuit so as to output one-phase AC power. The power semiconductor module according to the embodiment stores, for example, an IGBT and a diode as a switching element in the power semiconductor module.

As illustrated in FIG. 7, an opening 201 is provided such that the power semiconductor module 2 can be projected in the middle case 112 toward the resin case 112 side.

As illustrated in FIG. 5, the case 10 includes the middle case 112 and the resin case 12. The middle case 112 forms a space to store the control circuit board 30 therein by combining to the top cover 111 by setting the metal base 20 to a bottom surface. The board base 34 is disposed between the control circuit board 30 and the DC side bus bar 35, the control circuit board 30 is electromagnetically shielded from the DC side bus bar 35, and grounding of the control circuit board 30 is connected to the middle case 112 via the board base 34.

As illustrated in FIG. 5, the metal base 20 is disposed so as to separate a storage space 118 formed by the resin case 12 and a storage space 119 formed by the middle case 112. The metal base 20 forms the storage space 119 of the control circuit board 30 by being joined to the middle case 112. Another surface forms the storage space 118 of the resin case 12 by being joined to the resin case 12. As illustrated in FIG. 7, the metal base 20 includes openings 201 and 203. The power semiconductor module 2 and the capacitor lead 351 penetrate through the opening 201. The opening 203 fixes the power converter 100. The power semiconductor module 2 includes a module case made of meal and forms a switching element storage portion to store the switching element in the module case. The power semiconductor module 2 is fixed such that the switching element storage portion is projected on the resin case 12 side while closing the opening 201 of the metal base 20. The metal base 20 in which the power semiconductor module 2 is connected is joined on an opening side of the resin case 12, and consequently a cooling water passage is formed in the storage space 118 of the resin case 12. As illustrated in FIG. 5, the resin case 12 includes a flow channel 120 for cooling the power semiconductor module 2. In other words, in the embodiment, the storage space 118 functions as the flow channel 120.

One of six surfaces of the resin case 12 is opened, and the metal base 20 is joined so as to cover the opening side. The resin case 12 and the metal base 20 are joined by, for example, chemically processing or mechanically roughening a surface on the metal base 20 side and by injection-molding resin. Alternatively, the resin case 12 and the middle case 112 can be formed separately and joined by an adhesive. Thus, a module case of the power semiconductor module 2 is grounded to the metal base 20, and electrically functioning parts of an inverter such as a switching element and a control circuit are stored in the storage space 119 entirely made of metal.

By configuring in this manner, although a flow channel forming body of the power converter 100 is replaced to resin, noise immunity is not lost. Further, in the case whether it is necessary to forcibly cool the DC side bus bar 35 and the smoothing capacitor 38, those can be cooled by pressing onto the metal base 20 via such as an insulation material. The metal base 20 includes the opening 203 for fixing the power converter 100, and the power converter 100 can be fixed in a vehicle by passing a bolt through the opening 203. The metal base 20 has a thickness resistant to conditions of such as noise after the power converter 100 is fixed. It is considered that strength of the power converter 100 may be lowered by using resin in a part of the case 10 of the power converter 100. However, when the power converter 100 is mounted in a vehicle, the strength can be secured by fixing to a vehicle by using the metal base 20. At the same time, an earth of the power converter 100 can be secured in this configuration.

As illustrated in FIG. 6, the power semiconductor module 2 includes a metal module case on an outer side, and a cooling fin is formed on a surface of the module case. A switching element, such as an IGBT and a diode, is stored in the module case. In the case of a film capacitor, the smoothing capacitor 38 stores a capacitor element 352 in an outer case 353 and fixed by potting resin. In the embodiment, the capacitor element 352 is disposed on a side opposed to the storage space 119 which stores the control circuit board 30 via the metal base 20. By disposing as described above, in the case where the smoothing capacitor 38 causes a noise, effects of the noise on the control board 30 can be reduced.

Figure 8:
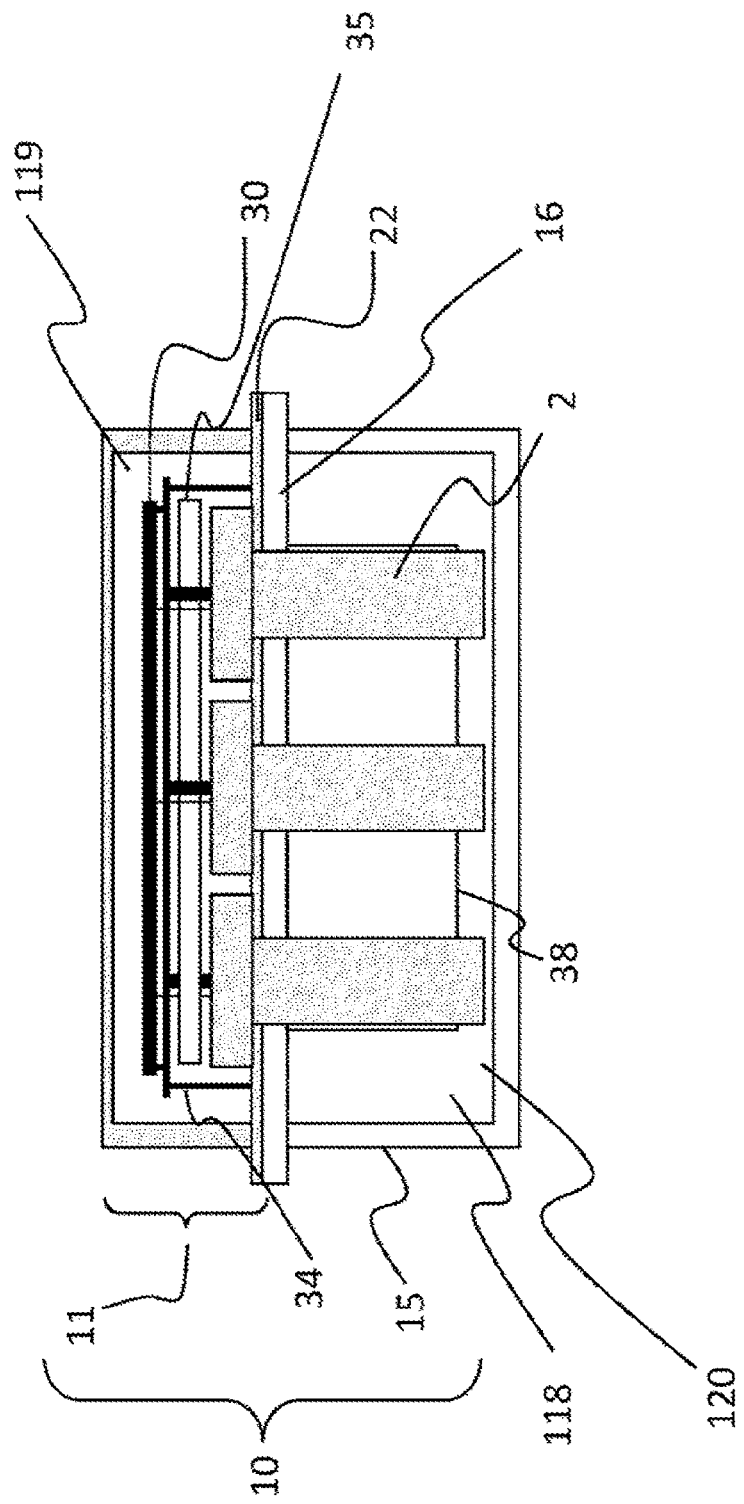
FIG. 8 is a sectional view of the power converter 100 according to another embodiment. An external view of the embodiment is same as the view illustrated in FIG. 1.

In general, the outer case 353 is often made of resin such as PPS. However, in the case where effects of noise on the outside of an inverter need to be further reduced, the outer case 353 can be made of metal such as aluminum. In the case where the outer case 353 is made of metal, the outer edge portion 353a can effectively block noise by electrically closely joining to the metal base 20. FIG. 8 is a sectional view of the power converter 100 according to another embodiment. An external view of the another embodiment is same as the view illustrated in FIG. 1.

The resin case 15 according to the embodiment includes the storage space 118 as with the resin case 12 described in FIG. 5 and also includes a resin wall 16 on a surface on a side connecting to the metal base 22. The metal base 22 forms an opening which is closed by the power semiconductor module 2 described in FIG. 7. The wall 16 forms an opening at a position opposed to an opening formed on the metal base 22. By configuring in this manner, in the case where a strength and cooling are not necessary in comparison with the example illustrated in FIG. 5, a usage amount of resin can be increased, and a weight can be further reduced.

REFERENCE SIGNS LIST 2 power semiconductor module
2A DC terminal
10 case
12 resin case
15 resin case
16 wall
20 metal base
22 metal base
30 control circuit board
34 board base
35 DC side bus bar
35A first area
35B second area
36 AC side bus bar
37 current sensor
38 smoothing capacitor
100 power converter
101 flange
111 top cover
112 middle case
115 AC side interface
116 DC side interface
117 fixing portion
118 storage space
119 storage space
120 flow channel
121 signal connector
122 control pin
201 opening
202 opening
203 opening
351 capacitor lead
352 capacitor terminal
353 outer case
353a outer edge portion

The invention claimed is:

1. A power converter, comprising:
a plurality of power semiconductor modules configured to convert DC power into AC power, wherein each of the power semiconductor modules includes a switching element and a metal module case that stores the switching element;
a control circuit board configured to control each power semiconductor module; and
a case configured to store the plurality of power semiconductor modules and the control circuit board, wherein the case comprises:
a resin case configured to store the plurality of power semiconductor modules in a refrigerant flow channel formed in the resin case, wherein the refrigerant flow channel provides a pathway for a refrigerant to cool the plurality of power semiconductor modules,
a metal case that is electrically coupled to the metal module case of each of the plurality of power semiconductor modules and configured to store the control circuit board, and
a metal base electrically coupled to the metal case and of each of the plurality of power semiconductor that is configured to mechanically couple the resin case to the metal case, wherein the metal base includes a separate opening for each of the plurality of semiconductor modules;
wherein each of the plurality of the power semiconductor modules are disposed in a respective separate opening of the metal base such that each respective module case is projected in the refrigerant flow channel.

2. The power converter according to claim 1, further comprising:
a smoothing capacitor electrically coupled to the plurality of semiconductor modules and configured to smooth the DC power;
wherein the smoothing capacitor is suspended in the refrigerant flow channel by the plurality of semiconductor modules.

3. The power converter according to claim 1, wherein the metal base includes a fixing portion configured to fix the power converter on a vehicle side.

4. A power converter, comprising:
a plurality of power semiconductor modules that each include a power semiconductor element stored in a metal module case;
a control circuit board configured to output a control signal to the plurality of power semiconductor modules;
a metal case to store the control circuit board;
a resin case configured to store the plurality of semiconductor modules and in a refrigerant flow channel space formed in the resin case, wherein the refrigerant flow channel space cools the metal module case of each of the plurality of power semiconductor modules; and
a metal base configured to mechanically couple the metal case to the resin case wherein the metal base includes a plurality of openings wherein each opening corresponds to a respective power semiconductor module of the plurality of semiconductor modules, the plurality of openings configured to communicate an internal space of the metal module case in which each power semiconductor element is stored and a space in which the control circuit board is disposed, and
wherein the power semiconductor element of each of the plurality of power semiconductor modules are connected to the control circuit board via their respective opening.

5. The power converter according to claim 4,
a smoothing capacitor electrically coupled to the plurality of power semiconductor modules and configured to smooth DC power
wherein the smoothing capacitor is suspended in the refrigerant flow channel space by the plurality of power semiconductor modules.

* * * * *